United States Patent
Maekawa et al.

(10) Patent No.: US 10,811,897 B2
(45) Date of Patent: Oct. 20, 2020

(54) RELAY DEVICE AND POWER SUPPLY DEVICE

(71) Applicants: AUTONETWORKS TECHNOLOGIES, LTD., Yokkaichi-shi, Mie (JP); SUMITOMO WIRING SYSTEMS, LTD., Yokkaichi-shi, Mie (JP); SUMITOMO ELECTRIC INDUSTRIES, LTD., Osaka-shi, Osaka (JP)

(72) Inventors: Kosei Maekawa, Yokkaichi (JP); Hiromichi Yasunori, Yokkaichi (JP); Katsuma Tsukamoto, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/301,489

(22) PCT Filed: May 10, 2017

(86) PCT No.: PCT/JP2017/017631
§ 371 (c)(1),
(2) Date: Nov. 14, 2018

(87) PCT Pub. No.: WO2017/208751
PCT Pub. Date: Dec. 7, 2017

(65) Prior Publication Data
US 2019/0237988 A1 Aug. 1, 2019

(30) Foreign Application Priority Data

May 31, 2016 (JP) ................................. 2016-108145

(51) Int. Cl.
*H02J 7/14* (2006.01)
*B60R 16/033* (2006.01)
(Continued)

(52) U.S. Cl.
CPC .......... *H02J 7/1423* (2013.01); *B60R 16/033* (2013.01); *G01R 31/006* (2013.01);
(Continued)

(58) Field of Classification Search
CPC . H02J 7/1423; H02J 7/345; H02J 7/14; B60R 16/033
(Continued)

(56) References Cited

U.S. PATENT DOCUMENTS 7,367,302 B2 * 5/2008 Bolz ...................... H02J 7/345
123/179.3
10,536,005 B2 * 1/2020 Yang ..................... H02J 7/1423
(Continued)

FOREIGN PATENT DOCUMENTS

JP 2012-130108 A 7/2012
JP 2014-046737 A 3/2014
(Continued)

OTHER PUBLICATIONS

Aug. 1, 2017 International Search Report issued in International Patent Application No. PCT/JP2017/017631.

*Primary Examiner* — Alfonso Perez Borroto
(74) *Attorney, Agent, or Firm* — Oliff PLC

(57) ABSTRACT

A configuration can supply a charging current from a power generator to two power storage devices, and can suppress, if an abnormality occurs on one power storage device side, the abnormality from affecting the other power storage device side. A relay device includes: a first switch configured to interrupt a first conductive path ; a second switch configured to interrupt a second conductive path ; a bypass circuit with
(Continued)

a series circuit in which a resistor and a third switch are connected in series to each other, the series circuit having one end electrically connected to a portion between the first switch and the first power storage device, and another end electrically connected to a portion between the second switch and the second power storage device; and a controller configured to turn the first switch, the second switch, and the third switch on/off.

6 Claims, 6 Drawing Sheets

(51) Int. Cl.
| | |
|---|---|
| *H02J 7/00* | (2006.01) |
| *H02H 7/18* | (2006.01) |
| *H01M 10/48* | (2006.01) |
| *H01M 10/44* | (2006.01) |
| *G01R 31/50* | (2020.01) |
| *G01R 31/00* | (2006.01) |
| *H01H 47/00* | (2006.01) |
| *B60R 16/03* | (2006.01) |
| *H02J 7/34* | (2006.01) |

(52) U.S. Cl.
CPC ........... *G01R 31/50* (2020.01); *H01H 47/002* (2013.01); *H01M 10/44* (2013.01); *H01M 10/48* (2013.01); *H02H 7/18* (2013.01); *H02J 7/00* (2013.01); *H02J 7/14* (2013.01); *B60R 16/03* (2013.01); *H02J 7/345* (2013.01)

(58) Field of Classification Search
USPC .......................................................... 307/29
See application file for complete search history.

(56) References Cited

U.S. PATENT DOCUMENTS

| | | | |
|---|---|---|---|
| 2014/0062414 A1 | 3/2014 | Yuhara et al. | |
| 2017/0166145 A1* | 6/2017 | Kinoshita | ............... B60R 16/03 |
| 2017/0197565 A1* | 7/2017 | Yoneyama | .............. B60R 16/03 |
| 2018/0354436 A1* | 12/2018 | Sato | ....................... B60R 16/033 |
| 2019/0241136 A1* | 8/2019 | Kuroda | .................... B60R 16/02 |
| 2019/0252908 A1* | 8/2019 | Takita | ..................... B60R 16/02 |

FOREIGN PATENT DOCUMENTS

| | | |
|---|---|---|
| JP | 2015-101288 A | 6/2015 |
| JP | 2015-150959 A | 8/2015 |

* cited by examiner

1

RELAY DEVICE AND POWER SUPPLY DEVICE

TECHNICAL FIELD

The present disclosure relates to a relay device that switches power supply from a power generator, and a power supply device.

BACKGROUND ART

Patent Document 1 discloses an example of an on-board power supply device. The power supply device disclosed in Patent Document 1 includes a lead storage battery and a lithium storage battery, and is provided with an electrical supply line serving as a power path between the lead storage battery and the lithium storage battery. Also, two MOSFETs for switching conduction of the electrical supply line on and off are provided. This power supply device performs control such that the MOSFETs are switched on/off based on the state of charge (SOC) of the lithium storage battery during, for example, non-regeneration (such as idle operation, acceleration traveling, or steady traveling) so that the SOC is within an optimum range.

CITATION LIST

Patent Document

Patent Document 1: JP 2012-130108A

SUMMARY

Technical Problem

The system disclosed in Patent Document 1 refers to a system for switching conduction between two power storage units on and off using a relay, but in such a system, if an abnormality occurs in, for example, one of the power supply systems, the abnormality will also affect the other power supply system, resulting in a situation where no suitable operating voltage may be supplied from both of the power supply systems.

For example, in the system disclosed in Patent Document 1, an alternator is connected to the power line on the main battery (lead storage battery) side and, if the sub battery (lithium storage battery) runs short of charge, the system keeps the relay in an ON state so that the sub battery can be charged with power supplied from the alternator. However, during charging, the main battery and the sub battery are completely conductive to each other since the relay is ON, and thus, if an earth fault occurs in the power supply system on one side of the relay, the other side of the relay will be instantaneously affected and the voltage of the power supply system on the other side will drastically decrease. In other words, since the battery voltages of both power supply systems are instantaneously reduced, no suitable operating voltage can be supplied to loads from either of the power supply systems.

The present disclosure was made in view of the aforementioned circumstances, and it is an object thereof to provide a relay device and a power supply device that can supply a charging current from a power generator to at least two power storage units, and can suppress, if an abnormality occurs on one power storage unit side, the abnormality from affecting the other power storage unit side.

2

Solution to Problem

According to an aspect of a preferred embodiment, a relay device includes:

a first switch unit configured to switch a first conductive path, which serves as a path between a power generator and a first power storage unit (i.e., power storage device), between a current flow permissive state and a current flow interruption state;

a second switch unit configured to switch a second conductive path, which serves as a path between the power generator and a second power storage unit (i.e., power storage device), between a current flow permissive state and a current flow interruption state;

a bypass unit/bypass path provided with a series circuit in which a resistance unit (i.e., a resistor) and a third switch unit are connected in series to each other, the series circuit having one end electrically connected to a portion between the first switch unit and the first power storage unit and another end electrically connected to a portion between the second switch unit and the second power storage unit; and a control unit configured to turn the first switch unit, the second switch unit, and the third switch unit on/off.

Advantageous Effects

The relay device of one aspect of a preferred embodiment can turn the first switch unit on and turn the second switch unit off to efficiently supply the first power storage unit with a charging current based on power generated by the power generator. Here, if an earth fault has occurred on the first power storage unit side, the portion in which the earth fault occurred and the conductive path on the second power storage unit side are insulated when the third switch unit is in the OFF state, and thus it is possible to prevent a voltage reduction in the conductive path on the second power storage unit side. Furthermore, even when the third switch unit is in the ON state, the resistance unit is interposed between the portion in which the earth fault occurred and the conductive path on the second power storage unit side, and thus it is possible to suppress a voltage reduction in the conductive path on the second power storage unit side by using a resistance component of the resistance unit. The same applies to a case where an earth fault has occurred on the second power storage unit side when the first switch unit is ON, and a voltage reduction in the conductive path on the first power storage unit side can be prevented since the portion in which the earth fault occurred and the conductive path on the first power storage unit side are insulated when the third switch unit is in the OFF state. Moreover, even when the third switch unit is in the ON state, the resistance unit is interposed between the portion in which the earth fault occurred and the conductive path on the first power storage unit side, and thus it is possible to suppress a voltage reduction on the first power storage unit side.

The relay device can turn the second switch unit on and turn the first switch unit off to efficiently supply the second power storage unit with a charging current based on power generated by the power generator. Here, if an earth fault has occurred on the first power storage unit side, the portion in which the earth fault occurred and the conductive path on the second power storage unit side are insulated when the third switch unit is in the OFF state, and thus it is possible to prevent a voltage reduction in the conductive path on the second power storage unit side. Furthermore, even when the third switch unit is in the ON state, the resistance unit is interposed between the portion in which the earth fault occurred and the conductive path on the second power storage unit side, and thus it is possible to suppress a voltage reduction in the conductive path on the second power storage unit side by using a resistance component of the resistance unit. The same applies to a case where an earth fault has occurred on the second power storage unit side when the second switch unit is ON, and a voltage reduction in the conductive path on the first power storage unit side can be prevented since the portion in which the earth fault occurred and the conductive path on the first power storage unit side are insulated when the third switch unit is in the OFF state. Moreover, even when the third switch unit is in the ON state, the resistance unit is interposed between the portion in which the earth fault occurred and the conductive path on the first power storage unit side, and thus it is possible to suppress a voltage reduction on the first power storage unit side.

Note that the above-described embodiment may have a configuration in which the second switch unit does not fail to be turned off when the first switch unit is turned on, and the first switch unit does not fail to be turned off when the second switch unit is turned on. Alternatively, the embodiment may also have a configuration in which, in addition to a first control in which the first switch unit is turned on and the second switch unit is turned off and a second control in which the second switch unit is turned on and the first switch unit is turned off, a third control in which both of the first switch unit and the second switch unit are turned on is performed.

DESCRIPTION OF EMBODIMENTS

Figure 1:
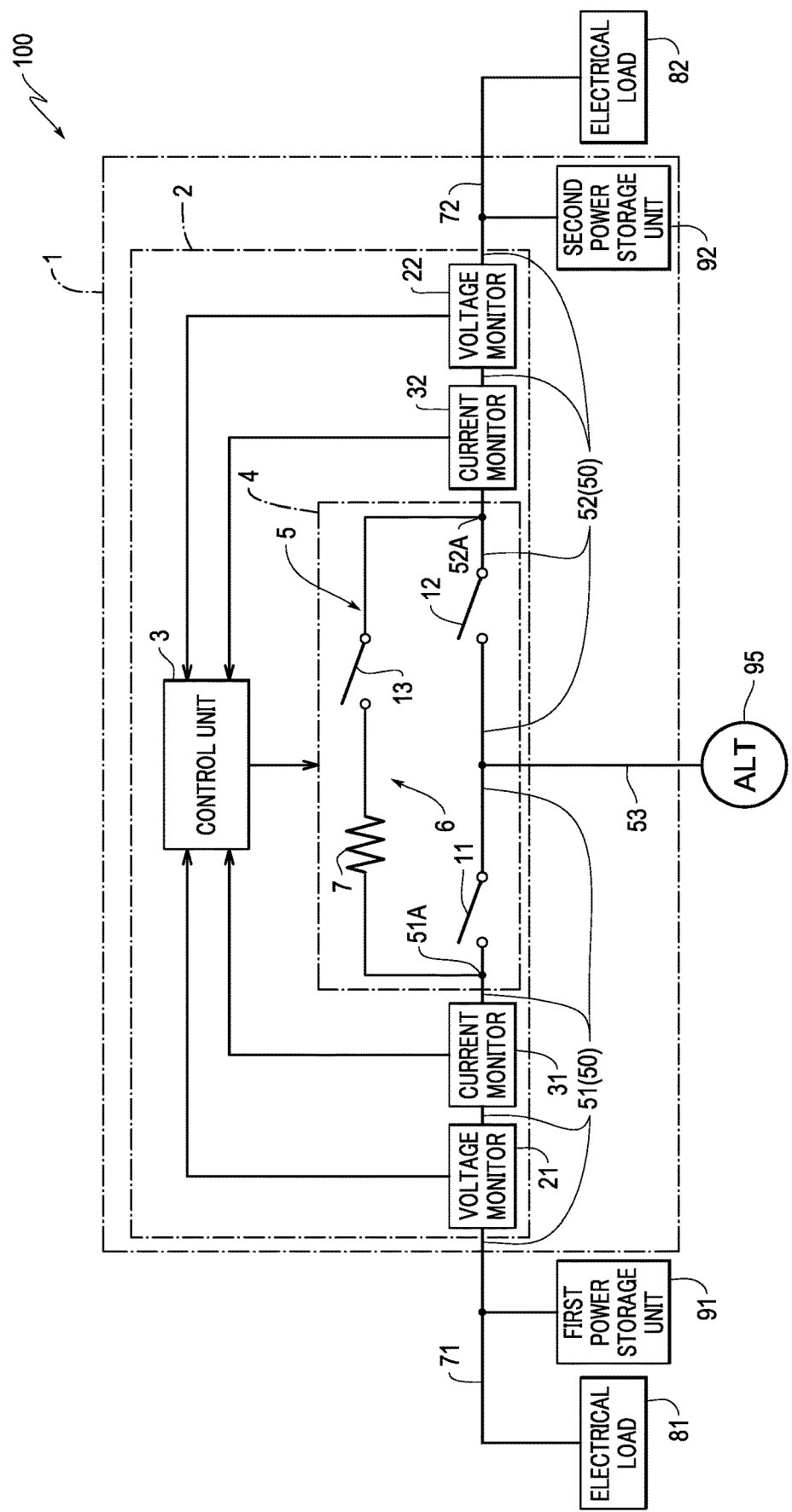
FIG. 1 is a circuit diagram schematically illustrating an example of an on-board power supply system in which a relay device and a power supply device are installed, according to Embodiment 1.

Hereinafter, preferred examples will be described.

The control unit may always turn off the second switch unit when at least the first switch unit is turned on, and may always turn off the first switch unit when at least the second switch unit is turned on.

In this way, by performing switching such that the second switch unit is always turned off when the first switch unit is turned on, and the first switch unit is always turned off when the second switch unit is turned on, it is possible to prevent such a state where the first power storage unit and the second power storage unit are conductive to each other via the first switch unit and the second switch unit.

The control unit may turn off the second switch unit and turn on the third switch unit when at least the first switch unit is turned on, and may turn off the first switch unit and turn on the third switch unit when at least the second switch unit is turned on.

According to this configuration, when the first switch unit is ON, a charging current from the power generator can be efficiently supplied to the first power storage unit via the first switch unit, and a relatively smaller charging current can also be supplied to the second power storage unit via the bypass unit. Moreover, while the two power storage units are charged in this way, the conduction between the first power storage unit and the second power storage unit via the first switch unit and the second switch unit is not realized, and the resistance unit is interposed between the conductive path on the first power storage unit side and the conductive path on the second power storage unit side. Accordingly, even if an earth fault occurs on one power storage unit side, a voltage reduction on the other power storage unit side can be suppressed due to a resistance component of the resistance unit.

The same effect is achieved also when the second switch unit is ON. In this case, the second power storage unit can be efficiently charged with a charging current from the power generator via the second switch unit, and a relatively smaller charging current can also be supplied to the first power storage unit via the bypass unit. Also, in this case, the resistance unit is interposed between the conductive path on the first power storage unit side and the conductive path on the second power storage unit side, and thus, even if an earth fault occurs on one power storage unit side, it is possible to suppress a voltage reduction on the other power storage unit side by using a resistance component of the resistance unit.

The relay device may further includes: a detection unit configured to detect at least one of a current and a voltage in at least one of the first conductive path and the second conductive path. If a value detected by the detection unit is within a predetermined abnormality range when at least the third switch unit is in an ON state, the control unit may switch the third switch unit to an OFF state.

According to this configuration, if an abnormality has occurred on one power storage unit side when the third switch unit is in the ON state, the third switch unit can be switched to the OFF state. Accordingly, it is possible to interrupt a current flowing through the bypass unit. Furthermore, since the configuration is such that the first switch unit and the second switch unit are not turned on at the same time, a current flowing from a path via the first switch unit and the second switch unit is also interrupted. Moreover, it is possible to suppress fluctuation in the voltage that may occur on the other power storage unit side (normal power storage unit side) up to the completion of the switching of the third switch unit to the OFF state, by using a resistance component of the resistance unit provided in the bypass unit, and thus it is possible to cut off the portion on the other power storage unit side (normal power storage unit side) from the portion in which the short-circuit abnormality has occurred while suppressing an influence of the abnormality.

A power supply device may be configured to include: the relay device according to any one of the above-described configurations; and the second power storage unit electrically connected thereto.

According to this configuration, a power supply device that has the same effect as that of the above-described relay device can be realized.

Embodiment 1

The following will describe Embodiment 1.

A power supply system 100 shown in FIG. 1 is configured as an on-board power supply system to be installed in a vehicle, and is provided with a first power storage unit 91 and a second power storage unit 92. A relay device 2 is part of the power supply system 100, and has a function of switching conduction between the first power storage unit 91 and the second power storage unit 92 on and off.

Hereinafter, a description will be given taking, as a representative example for the on-board power supply system 100, a configuration that includes a first electrical load 81, which is a main load, and a second electrical load 82, which is an auxiliary load, the first electrical load 81 and the second electrical load 82 having the same function. Note however that this configuration is merely a representative example, and the application of the relay device 2 is not limited to this configuration.

The first electrical load 81, which serves as a main load, is a motorized power steering system for example, and is configured to be supplied with power from the first power storage unit 91 so that an electric component such as a motor operates. The second electrical load 82, which serves as a sub load, is a motorized power steering system that has the same configuration and function as those of the first electrical load 81. The power supply system 100 is configured as a system in which, if the first electrical load 81 malfunctions, the second electrical load 82 operates in place of the first electrical load 81 so that the function of the first electrical load 81 can be maintained even if the first electrical load 81 malfunctions.

The first power storage unit 91 is a power supply unit that can supply power to the first electrical load 81, and is made of a well-known power source such as a lead battery, for example.

The second power storage unit 92 is a power supply unit that can supply power to the second electrical load 82, and is made of a well-known power source such as a lithium-ion battery or an electric double layer capacitor, for example. In the present configuration, an on-board power supply device 1 (hereinafter, also referred to simply as "power supply device 1") including the second power storage unit 92 and the relay device 2, which will be described later, is provided. In the power supply device 1, the relay device 2 and the second power storage unit 92 are provided as, for example, an integrated unit. Various examples of a configuration in which the relay device 2 and the second power storage unit 92 are provided as an integrated unit are conceivable, and include a configuration in which the relay device 2 and the second power storage unit 92 are fixed to a common frame, a configuration in which the relay device 2 and the second power storage unit 92 are accommodated in a common case, and a configuration in which the second power storage unit 92 is mounted on a substrate that constitutes part of the relay device 2.

The first power storage unit 91 and the first electrical load 81 are electrically connected to a wiring 71 provided outside of the relay device 2. The wiring 71 is made of, for example, a wire or the like, and is electrically connected to a first conductive path 51, which will be described later, and is electrically connected to one end of a relay unit 4 via the first conductive path 51. The second power storage unit 92 and the second electrical load 82 are electrically connected to a wiring 72 provided outside of the relay device 2. The wiring 72 is made of, for example, a wire or the like, and is electrically connected to a second conductive path 52, which will be described later, and is electrically connected to the other end of the relay unit 4 via the second conductive path 52.

A power generator 95 is configured as a well-known alternator, and is configured to operate at a predetermined time and apply a generated voltage to a wiring 53. The power generator 95 is capable of controlling deceleration energy regeneration so that the regenerative energy generated during deceleration can be used to charge, for example, the first power storage unit 91.

The wiring 53, which is a path for supplying power generated by the power generator 95, is made of a wire, a wiring pattern, or the like, for example, and is electrically connected to a later-described conductive path provided between a first switch unit 11 and a second switch unit 12. Note that, in the example of FIG. 1, the first conductive path 51 refers to a conductive path branched from an end of the wiring 53 toward the first power storage unit 91, and the second conductive path 52 refers to a conductive path branched from the end of wiring 53 toward the second power storage unit 92.

The relay device 2 is provided with the first conductive path 51, the second conductive path 52, the relay unit 4, a first voltage detection unit 21 (voltage monitor), a first current detection unit 31 (current monitor), a second voltage detection unit 22 (voltage monitor), a second current detection unit 32 (current monitor), and a control unit 3. The relay device 2 is configured as, for example, a circuit board obtained by mounting various types of electronic components on the board body, in which the first conductive path 51 is connected to the wiring 71 via a not-shown terminal and the second conductive path 52 is connected to the wiring 72 via a not-shown terminal.

The first conductive path 51 has one end connected to the wiring 53, and the other end connected to the wiring 71 on the first power storage unit 91 side, the first conductive path 51 being electrically connected to the first power storage unit 91 via the wiring 71. The first conductive path 51 is a power line, and serves as a path through which a charging current to be supplied to the first power storage unit 91 based on the generated power from the power generator 95 flows while the first switch unit 11 is ON. The first voltage detection unit 21 and the first current detection unit 31, which will be described later, are provided on the first conductive path 51.

The second conductive path 52 is connected to the wiring 72 on the second power storage unit 92 side, and is electrically connected to the second power storage unit 92 via the wiring 72. The second conductive path 52 is a power line, and serves as a path through which a charging current to be supplied to the second power storage unit 92 based on the generated power from the power generator 95 flows while the second switch unit 12 is ON. The second voltage detection unit 22 and the second current detection unit 32, which will be described later, are provided on the second conductive path 52.

The relay unit 4 is provided with the first switch unit 11, the second switch unit 12, and a bypass unit 5. The first switch unit 11 is constituted by, for example, one or more well-known semiconductor switches or the like, and has a function of switching the first conductive path 51, which serves as a path between the conduction power generator 95 and the first power storage unit 91, between a current flow permissive state and a current flow interruption state. The second switch unit 12 is constituted by, for example, one or more well-known semiconductor switches or the like, and has a function of switching the second conductive path 52, which serves as a path between the power generator 95 and the second power storage unit 92, between a current flow permissive state and a current flow interruption state. The bypass unit 5 has a series circuit 6, in which a resistance unit 7 and a third switch unit 13 are connected in series to each other. One end of the series circuit 6 is electrically connected to a connection 51A of the first conductive path 51 that is located between the first switch unit 11 and the first power storage unit 91, and the other end of the series circuit 6 is electrically connected to a connection 52A of the second conductive path 52 that is located between the second switch unit 12 and the second power storage unit 92.

In the relay unit 4, when the first switch unit 11 is in an ON state, the first switch unit 11 is conductive and a charging current can be supplied from the power generator 95 to the first power storage unit 91 via the first switch unit 11. When the first switch unit 11 is in an OFF state, the first switch unit 11 is in an interrupting state of interrupting a current flowing from the power generator 95 side to the first power storage unit 91 side via the first switch unit 11.

Similarly, when the second switch unit 12 is in the ON state, the second switch unit 12 is conductive and a charging current can be supplied from the power generator 95 to the second power storage unit 92 via the second switch unit 12. When the second switch unit 12 is in the OFF state, the second switch unit 12 is in an interrupting state of interrupting a current flowing from the power generator 95 side to the second power storage unit 92 side via the second switch unit 12.

In the series circuit 6, when the third switch unit 13 is in the ON state, the third switch unit 13 is conductive, and the series circuit 6 is in a state in which a current flows through the bypass unit 5. When the third switch unit 13 is in the OFF state, the third switch unit 13 is non-conductive and the series circuit 6 is in a state in which no current flows through the bypass unit 5.

Figure 2:
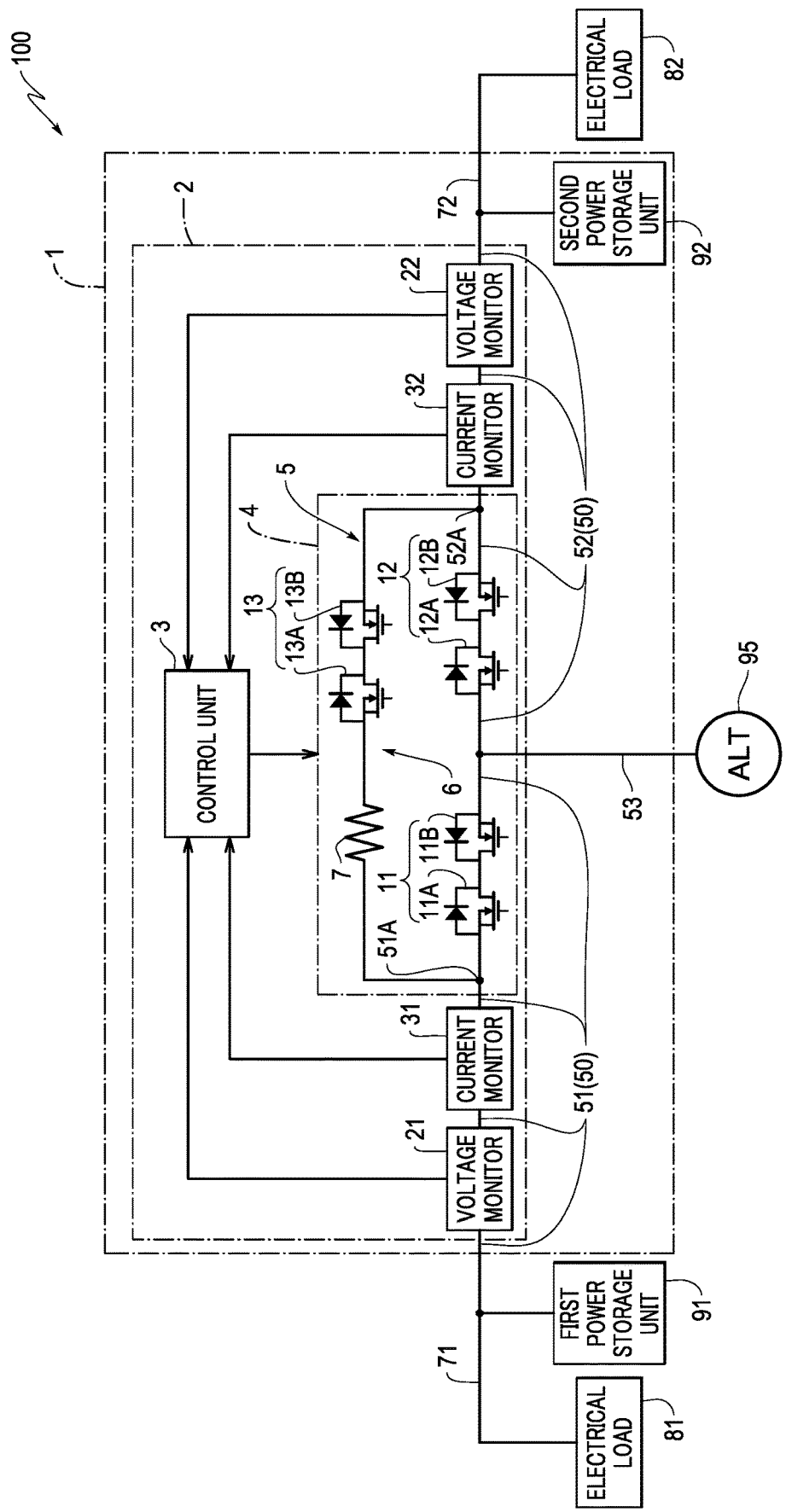
FIG. 2 is a circuit diagram specifically illustrating representative examples of the relay device and the power supply device of the on-board power supply system shown in FIG. 1.

Examples of the first switch unit 11, the second switch unit 12, and the third switch unit 13 that have such functions are shown in FIG. 2. In the examples shown in FIG. 2, the first switch unit 11 is constituted by two MOSFETs 11A and 11B that are connected in series to each other in different directions with respect to each other. The second switch unit 12 is constituted by two MOSFETs 12A and 12B that are connected in series to each other in different directions with respect to each other. The third switch unit 13 is constituted by two MOSFETs 13A and 13B that are connected in series to each other in different directions with respect to each other. The two MOSFETs, namely, the MOSFETs 11A and 11B, which constitute the first switch unit 11, the MOSFETs 12A and 12B, which constitutes the second switch unit 12, and the MOSFETs 13A and 13B, which constitute the third switch unit 13, are provided in series in a so-called back-to-back state (state in which body diodes are arranged in directions opposite to each other), and thus each of the switch units interrupts bidirectional current flows if the corresponding two MOSFETs are in the OFF state.

The first voltage detection unit 21 shown in FIG. 1 and the like is configured as a well-known voltage detection circuit (voltage monitor), and has a function of detecting a voltage at the first conductive path 51. The value of the voltage detected by the first voltage detection unit 21 is input to the control unit 3 via a signal line.

The second voltage detection unit 22 is configured as a well-known voltage detection circuit (voltage monitor), and has a function of detecting a voltage at the second conductive path 52. The value of the voltage detected by the second voltage detection unit 22 is input to the control unit 3 via a signal line.

The first current detection unit 31 is configured as a well-known current detection circuit (current monitor), and has a function of detecting a current flowing through the first conductive path 51. The value of the current detected by the first current detection unit 31 is input to the control unit 3 via a signal line.

The second current detection unit 32 is configured as a well-known current detection circuit (current monitor), and has a function of detecting a current flowing through the second conductive path 52. The value of the current detected by the second current detection unit 32 is input to the control unit 3 via a signal line.

The control unit 3 includes, for example, a microcomputer provided with a CPU, a ROM, a RAM, an A/D converter, and the like. A value detected by the first voltage detection unit 21 (voltage value of the first conductive path 51), a value detected by the second voltage detection unit 22 (voltage value of the second conductive path 52), a value detected by the first current detection unit 31 (current value of the first conductive path 51), and a value detected by the second current detection unit 32 (current value of the second conductive path 52) are input to the control unit 3. The detected values input to the control unit 3 are converted into digital values by the A/D converter of the control unit 3.

Here, a basic operation of the relay device 2 in a normal state will be described.

In the relay device 2 shown in FIG. 1 and the like, the control unit 3 turns the first switch unit 11, the second switch unit 12, and the third switch unit 13 on/off.

In the relay device 2, if a predetermined first condition is met, the first switch unit 11 is turned on, and the first power storage unit 91 is charged. The timing at which the control unit 3 turns the first switch unit 11 on is not particularly limited, and the number of conditions is also not limited to one. For example, the control unit 3 may be configured to continuously monitor the voltage output from the first power storage unit 91, and turn the first switch unit 11 on if the voltage output from the first power storage unit 91 has decreased to a value lower than a predetermined first threshold. Furthermore, when the power generator 95 performs regenerative control, for example, when it generates regenerative power during deceleration of the vehicle, the control unit 3 may also be configured to turn the first switch unit 11 on, always or if a predetermined condition is met (for example, if the voltage output from the first power storage unit 91 is less than a predetermined value). Of course, the first switch unit 11 may also be turned on at another timing.

The control unit 3 turns the second switch unit 12 off when at least the first switch unit 11 is turned on. In other words, control is performed such that the first switch unit 11 and the second switch unit 12 are not turned on at the same time. Accordingly, a conductive path 50, which is constituted by the first conductive path 51 and the second conductive path 52, is not conductive between the connection 51A and the connection 52A, and the current flow between the first power storage unit 91 and the second power storage unit 92 only via the conductive path 50 is not permitted. In other words, no current flows between the first power storage unit 91 and the second power storage unit 92 without flowing through the bypass unit 5.

Figure 3:
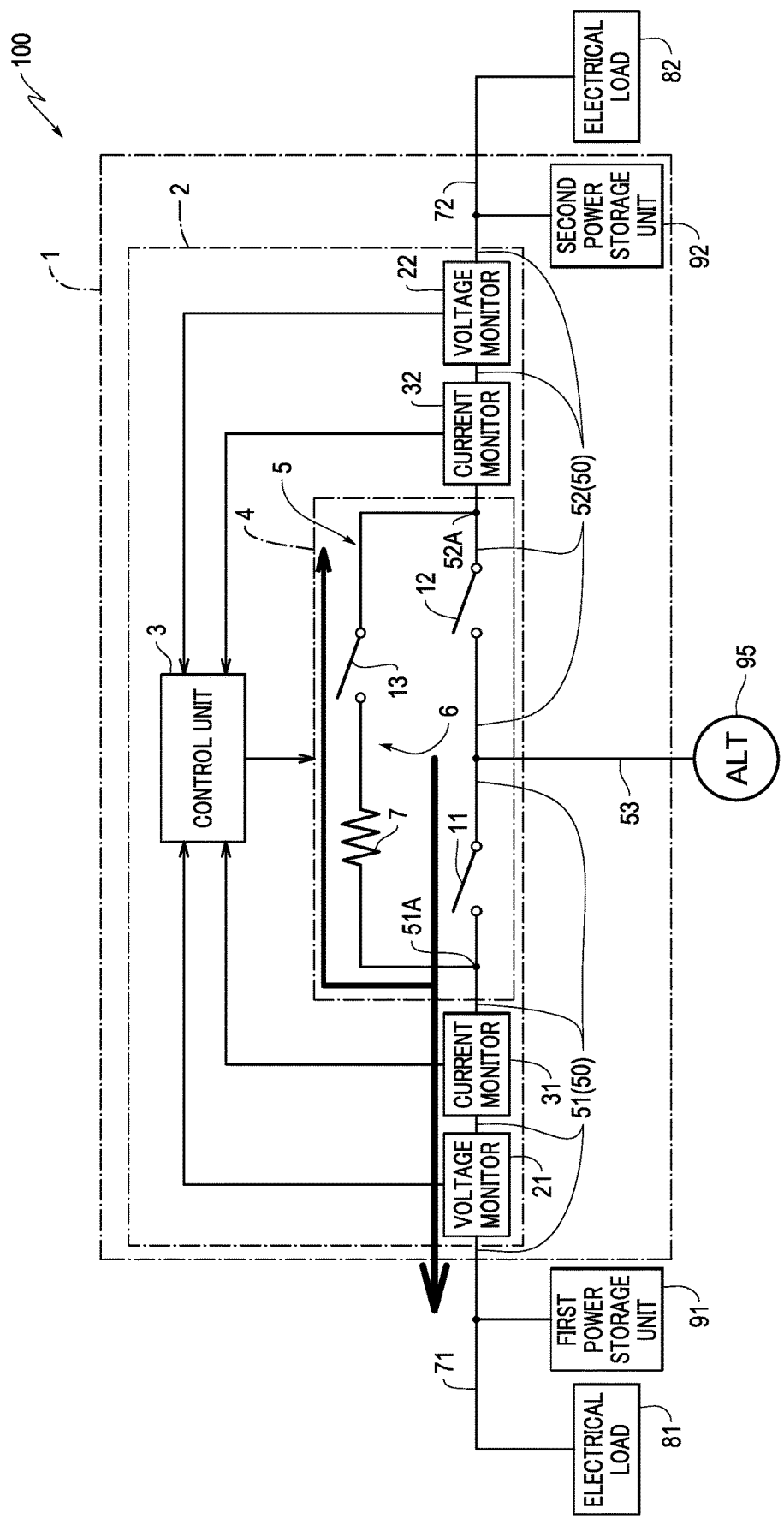
FIG. 3 is diagram illustrating an operation, during a first control, in the on-board power supply system of FIG. 1.

When turning the first switch unit 11 on, the control unit 3 turns the third switch unit 13 on, always or under a predetermined condition (for example, if the voltage output from the second power storage unit 92 is less than a predetermined value). If the second switch unit 12 is turned off and the third switch unit 13 is turned on when the first switch unit 11 is turned on, a charging current from the power generator 95, when power is generated by the power generator 95, can be efficiently supplied to the first power storage unit 91 via the first switch unit 11 having a low resistance value, and a relatively smaller charging current can be supplied to the second power storage unit 92 via the bypass unit 5, as schematically shown in FIG. 3.

In the relay device 2, when a predetermined second condition is met, the second switch unit 12 is turned on and the second power storage unit 92 is charged. The timing at which the control unit 3 turns the second switch unit 12 on is not particularly limited, and the number of conditions is also not limited to one. For example, the control unit 3 may also be configured to continuously monitor the voltage output from the second power storage unit 92, and turn the second switch unit 12 on if the voltage output from the second power storage unit 92 has decreased to a value lower than a predetermined second threshold and when the first switch unit 11 is not turned on. Alternatively, when the power generator 95 generates regenerative power during deceleration of the vehicle and when the first switch unit 11 is not turned on, the control unit 3 may turn the second switch unit 12 on, always or if a predetermined condition is met (for example, if the voltage output from second power storage unit 92 is less than a predetermined value). Of course, the second switch unit 12 may also be turned on at another timing.

The control unit 3 turns the first switch unit 11 off when at least the second switch unit 12 is turned on. Also, in this case, control is performed such that the first switch unit 11 and the second switch unit 12 are not turned on at the same time. Also, when turning the second switch unit 12 on, the control unit 3 turns the third switch unit 13 on, always or under a predetermined condition (for example, if the voltage output from the first power storage unit 91 is less than a predetermined value). If the first switch unit 11 is turned off and the third switch unit 13 is turned on when the second switch unit 12 is turned on, a charging current from the power generator 95, when power is generated by the power generator 95, can be efficiently supplied to the second power storage unit 92 via the second switch unit 12 that has a low resistance value, and a relatively smaller charging current can be supplied to the first power storage unit 91 via the bypass unit 5.

In this way, the control unit 3 can perform a first control such that, when at least the first switch unit 11 is turned on, the second switch unit 12 is turned off and the third switch is turned on, and a second control such that, when at least the second switch unit 12 is turned on, the first switch unit 11 is turned off and the third switch unit 13 is turned on.

The following will describe an operation of the relay device 2 in an abnormal state.

If a predetermined abnormal state has occurred, the control unit 3 forcibly turns off the first switch unit 11, the second switch unit 12, and the third switch unit 13 that are provided in the relay unit 4. In other words, a switch unit that was in the OFF state prior to the occurrence of the predetermined abnormal state is kept off, and a switch unit that was in the ON state prior to the occurrence of the predetermined abnormal state is promptly switched to the OFF state. Specifically, the control unit 3 continuously monitors detected values (voltage values) input from the first voltage detection unit 21 and the second voltage detection unit 22, and turns off all of the first switch unit 11, the second switch unit 12, and the third switch unit 13, if the detected value input from at least one of the first voltage detection unit 21 and the second voltage detection unit 22 is a predetermined abnormality threshold Vth or less. Note that the value of the abnormality threshold Vth is not particularly limited but can be set to a value lower than the above-described first threshold and second threshold, for example.

The following will describe an example of the operation performed when an abnormality has occurred.

Figure 4:
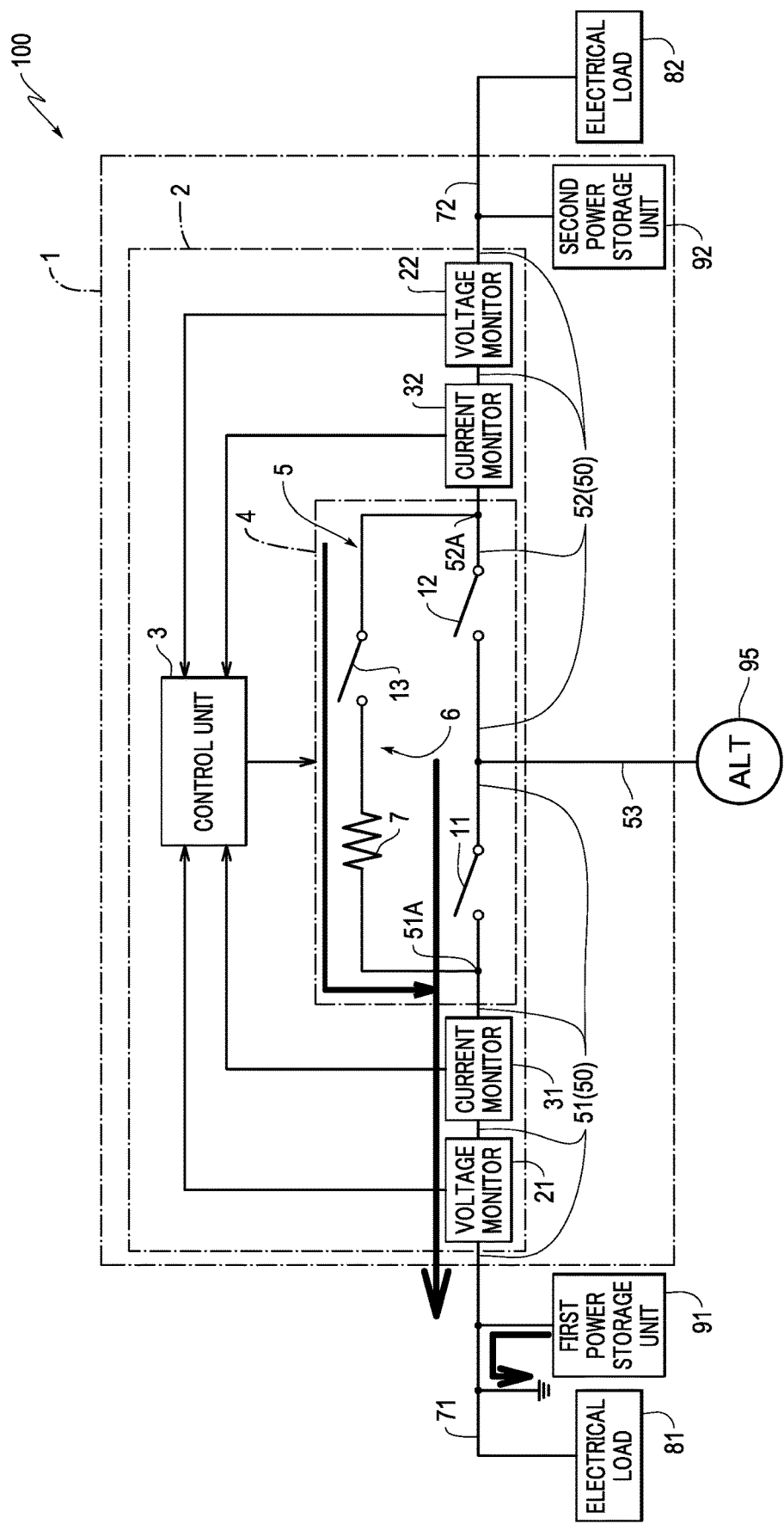
FIG. 4 is a diagram illustrating a case where, during the first control, an earth fault has occurred in a wiring on a first power storage unit side in the on-board power supply system of FIG. 1.

First, a case where an abnormality has occurred during the above-described first control will be described. Assuming that, in the relay unit 4, the first switch unit 11 and the third switch unit 13 are in the ON state and the second switch unit 12 is in the OFF state, and the power generator 95 is generating power, if, as shown in FIG. 4, an earth fault occurs in the wiring 71 connected to the first power storage unit 91, the voltage values at the wiring 71 and the first conductive path 51 will instantaneously change to values close to 0V (ground potential), and a current will flow into the portion in which the earth fault has occurred, as shown in FIG. 4. Note however that the bypass unit 5 is provided with the resistance unit 7, and thus the current will flow from the second power storage unit 92 side into the portion in which the earth fault has occurred via the resistance unit 7. In other words, in such a case where an earth fault has occurred, the voltage at the conductive path (that is, the second conductive path 52) arranged on the side opposite to the side on which the earth fault has occurred with the resistance unit 7 interposed therebetween is significantly suppressed from decreasing due to a resistance component of the resistance unit 7, without decreasing to a value close to 0V. Furthermore, in such a case where an earth fault has occurred as shown in FIG. 4, the voltage value detected by the first voltage detection unit 21 instantaneously decreases to a value lower than the abnormality threshold Vth immediately after the earth fault has occurred, and thus the control unit 3 can instantaneously determine that an abnormality has occurred immediately after the earth fault has occurred. Also, the control unit 3 can promptly turn all of the first switch unit 11, the second switch unit 12, and the third switch unit 13 off, and can rapidly interrupt the current flow between the first conductive path 51 and the second conductive path 52

Accordingly, if an earth fault has occurred on the first conductive path 51 side during the execution of the first control (that is, the second switch unit 12 is kept in the OFF state and the first switch unit 11 and the third switch unit 13 are ON so that a charging current is supplied to both power storage units), a voltage reduction on the second conductive path 52 side can be suppressed due to a resistance component of the resistance unit 7 provided in the bypass unit 5. Since it is possible to rapidly turn off all of the switch units while suppressing a voltage reduction in this way, it is possible to further reduce the likelihood of a voltage supplied to the load connected to the second conductive path 52 decreasing to a value lower than a required voltage.

Such functions and effects are also achieved when an earth fault has occurred on the second power storage unit 92 side during the first control. In other words, if an earth fault has occurred on the second conductive path 52 side while the second switch unit 12 is kept in the OFF state and the first switch unit 11 and the third switch unit 13 are ON so that a charging current is supplied to both power storage units, a voltage reduction on the first conductive path 51 side can be suppressed due to a resistance component of the resistance unit 7 provided in the bypass unit 5. Since it is possible to rapidly turn off all of the switch units while suppressing a voltage reduction in this way, it is possible to further reduce the likelihood of a voltage supplied to the load connected to the first conductive path 51 decreasing to a value lower than a required voltage.

Figure 5:
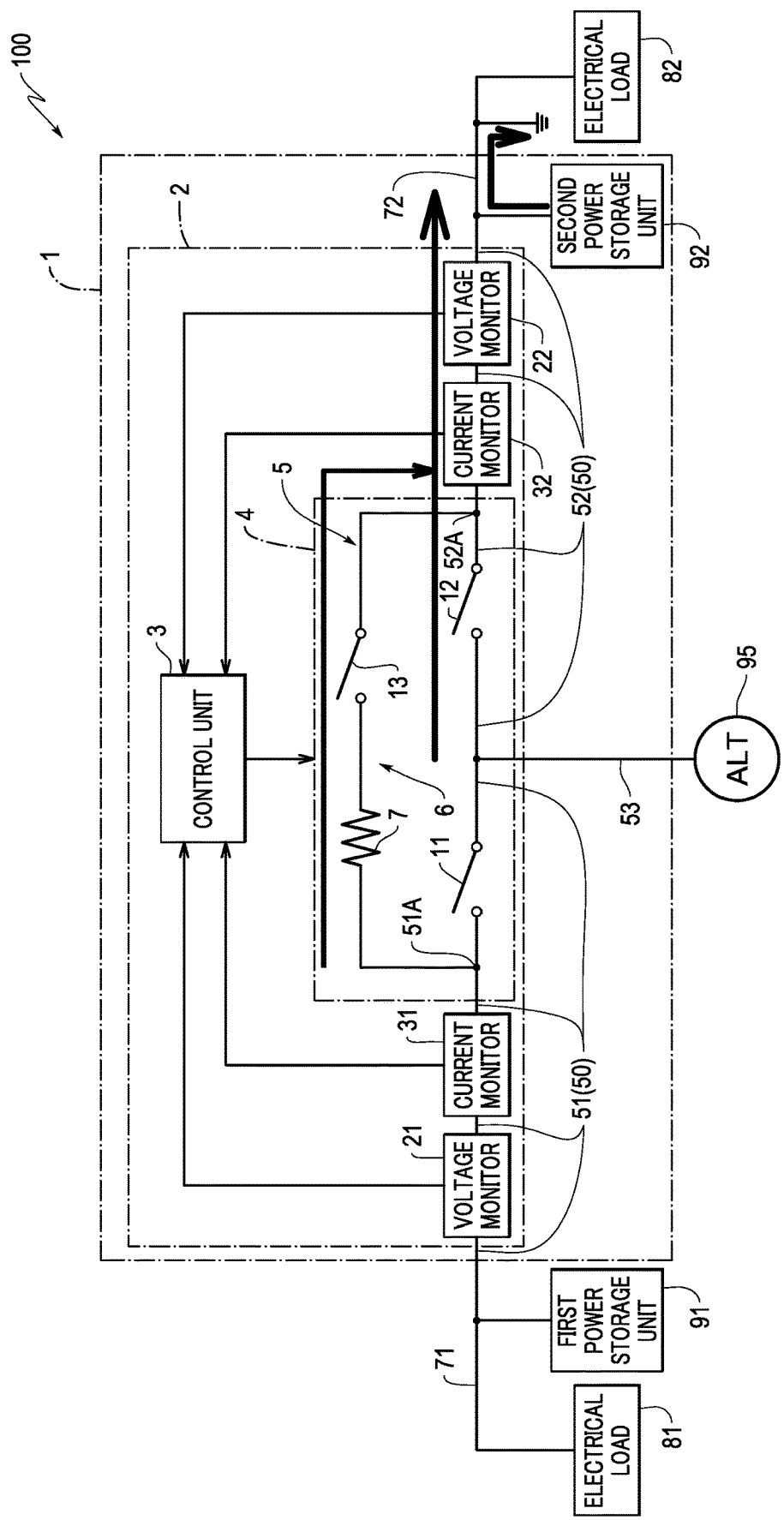
FIG. 5 is a diagram illustrating a case where, during a second control, an earth fault has occurred in a wiring on a second power storage unit side in the on-board power supply system of FIG. 1.

Next, a case where an abnormality has occurred during the above-described second control will be described. Assuming that, in the relay unit 4, the second switch unit 12 and the third switch unit 13 are in the ON state and the first switch unit 11 is in the OFF state, and the power generator 95 is generating power, if, as shown in FIG. 5, an earth fault occurs in the wiring 72 connected to the second power storage unit 92, the voltage values at the wiring 72 and the second conductive path 52 will instantaneously change to values close to 0V (ground potential), and a current will flow into the portion in which the earth fault has occurred, as shown in FIG. 5. Note however that the bypass unit 5 is provided with the resistance unit 7, and thus the current will flow from the first power storage unit 91 side into the portion in which the earth fault has occurred via the resistance unit 7. In other words, in such a case where an earth fault has occurred, the voltage of the conductive path (that is, the first conductive path 51) arranged on the side opposite to the side on which the earth fault has occurred with the resistance unit 7 interposed therebetween is significantly suppressed from decreasing due to a resistance component of the resistance unit 7, without decreasing to a value close to 0V. Furthermore, in such a case where an earth fault has occurred as shown in FIG. 5, the voltage value detected by the second voltage detection unit 22 instantaneously decreases to a value lower than the abnormality threshold Vth immediately after the earth fault has occurred, and thus the control unit 3 can instantaneously determine that an abnormality has occurred immediately after the earth fault has occurred. Also, the control unit 3 can promptly turn all of the first switch unit 11, the second switch unit 12, and the third switch unit 13 off, and can rapidly interrupt the current flow between the first conductive path 51 and the second conductive path 52.

In this way, if an earth fault has occurred on the second conductive path 52 side during the execution of the second control (that is, the first switch unit 11 is kept in the OFF state and the second switch unit 12 and the third switch unit 13 are ON so that a charging current is supplied to both power storage units), a voltage reduction on the first conductive path 51 side can be suppressed due to a resistance component of the resistance unit 7 provided in the bypass unit 5. Since it is possible to rapidly turn off all of the switch units while suppressing a voltage reduction in this way, it is possible to further reduce the likelihood of a voltage supplied to the load connected to the first conductive path 51 decreasing to a value lower than a required voltage.

Such functions and effects are also achieved when an earth fault has occurred on the first power storage unit 91 side during the second control. In other words, if an earth fault has occurred on the first conductive path 51 side while the first switch unit 11 is kept in the OFF state and the second switch unit 12 and the third switch unit 13 are ON so that a charging current is supplied to both power storage units, a voltage reduction on the second conductive path 52 side can be suppressed due to a resistance component of the resistance unit 7 provided in the bypass unit 5. Since it is possible to rapidly turn off all of the switch units while suppressing a voltage reduction in this way, it is possible to further reduce the likelihood of a voltage supplied to the load connected to the second conductive path 52 decreasing to a value lower than a required voltage.

Note that the above-described specific example of an operation performed when an abnormality has occurred refers to an example in which, if the detected value of the first voltage detection unit 21 or the second voltage detection unit 22 is in an abnormality range during the charge control, the control unit 3 turns all of the first switch unit 11, the second switch unit 12, and the third switch unit 13 off, but is not limited to this. In addition to or in place of the above-described control, the control unit 3 may also turn all of the first switch unit 11, the second switch unit 12, and the third switch unit 13 off if the detected value of the first current detection unit 31 or the second current detection unit 32 is in an abnormality range during the charge control (for example, if the value is larger than a predetermined overcurrent threshold).

In the present configuration, the first voltage detection unit 21, the second voltage detection unit 22, the first current detection unit 31, and the second current detection unit 32 correspond to examples of a detection unit, and have a function of detecting at least one of a current and a voltage of at least one of the first conductive path 51 and the second conductive path 52. Also, the control unit 3 has a function of switching the first switch unit 11, the second switch unit 12, and the third switch unit 13, and specifically turns all of the first switch unit 11, the second switch unit 12, and the third switch unit 13 off, if the value detected by the detection unit is in a predetermined abnormality range corresponding to the earth fault state when at least any of the first switch unit 11, the second switch unit 12, and the third switch unit 13 is in the ON state.

As described above, the relay device 2 and the power supply device 1 of the present configuration can turn the first switch unit 11 on and turn the second switch unit 12 off to efficiently supply the first power storage unit 91 with a charging current based on power generated by the power generator 95. Here, if an earth fault has occurred on the first power storage unit 91 side, the portion in which the earth fault occurred and the conductive path on the second power storage unit 92 side are insulated when the third switch unit 13 is in the OFF state, and thus it is possible to prevent a voltage reduction in the conductive path on the second power storage unit 92 side. Furthermore, even when the third switch unit 13 is in the ON state, the resistance unit 7 is interposed between the portion in which the earth fault occurred and the conductive path on the second power storage unit 92 side, and thus it is possible to suppress a voltage reduction in the conductive path on the second power storage unit 92 side by using a resistance component of the resistance unit 7. The same applies to a case where an earth fault has occurred on the second power storage unit 92 side when the first switch unit 11 is ON, and a voltage reduction in the conductive path on the first power storage unit 91 side can be prevented since the portion in which the earth fault occurred and the conductive path on the first power storage unit 91 side are insulated when the third switch unit 13 is in the OFF state. Moreover, even when the third switch unit 13 is in the ON state, the resistance unit 7 is interposed between the portion in which the earth fault occurred and the conductive path on the first power storage unit 91 side, and thus it is possible to suppress a voltage reduction on the first power storage unit 91 side.

Similarly, the relay device 2 can turn the second switch unit 12 on and turn the first switch unit 11 off to efficiently supply the second power storage unit 92 with a charging current based on power generated by the power generator 95. Here, if an earth fault has occurred on the first power storage unit 91 side, the portion in which the earth fault occurred and the conductive path on the second power storage unit 92 side are insulated when the third switch unit 13 is in the OFF state, and thus it is possible to prevent a voltage reduction in the conductive path on the second power storage unit 92 side. Furthermore, even when the third switch unit 13 is in the ON state, the resistance unit 7 is interposed between the portion in which the earth fault occurred and the conductive path on the second power storage unit 92 side, and thus it is possible to suppress a voltage reduction in the conductive path on the second power storage unit 92 side by using a resistance component of the resistance unit 7. The same applies to a case where an earth fault has occurred on the second power storage unit 92 side when the second switch unit 12 is ON, and a voltage reduction in the conductive path on the first power storage unit 91 side can be prevented since the portion in which the earth fault occurred and the conductive path on the first power storage unit 91 side are insulated when the third switch unit 13 is in the OFF state. Moreover, even when the third switch unit 13 is in the ON state, the resistance unit 7 is interposed between the portion in which the earth fault occurred and the conductive path on the first power storage unit 91 side, and thus it is possible to suppress a voltage reduction on the first power storage unit 91 side.

The control unit 3 can perform control such that the second switch unit 12 is always turned off when at least the first switch unit 11 is turned on, and the first switch unit 11 is always turned off when at least the second switch unit 12 is turned on. In this way, by performing switching such that the second switch unit 12 is turned off when the first switch unit 11 is turned on, and the first switch unit 11 is turned off when the second switch unit 12 is turned on, it is possible to prevent such a state where the first power storage unit 91 and the second power storage unit 92 are conductive to each other via the first switch unit 11 and the second switch unit 12.

The control unit 3 is configured to be able to perform the first control such that, when at least the first switch unit 11 is turned on, the second switch unit 12 is turned off and the third switch is turned on, and perform the second control such that, when at least the second switch unit 12 is turned on, the first switch unit 11 is turned off and the third switch unit 13 is turned on. According to the configuration, when the first switch unit 11 is ON, a charging current from the power generator 95 can be efficiently supplied to the first power storage unit 91 via the first switch unit 11, and a relatively smaller charging current can also be supplied to the second power storage unit 92 via the bypass unit 5. Moreover, while the two power storage units are charged in this way, the conduction between the first power storage unit 91 and the second power storage unit 92 via the first switch unit 11 and the second switch unit 12 is not realized, and the resistance unit 7 is interposed between the conductive path on the first power storage unit 91 side and the conductive path on the second power storage unit 92 side. Accordingly, even if an earth fault occurs on one power storage unit side, a voltage reduction on the other power storage unit side can be suppressed due to a resistance component of the resistance unit 7. The same effect is achieved also when the second switch unit 12 is ON. In this case, the second power storage unit 92 can be efficiently charged with a charging current from the power generator 95 via the second switch unit 12, and a relatively smaller charging current can also be supplied to the first power storage unit 91 via the bypass unit 5. Also, in this case, the resistance unit 7 is interposed between the conductive path on the first power storage unit 91 side and the conductive path on the second power storage unit 92 side, and thus, even if an earth fault occurs on one power storage unit side, it is possible to suppress a voltage reduction on the other power storage unit side by using a resistance component of the resistance unit 7.

The relay device 2 includes multiple detections units (the first voltage detection unit 21, the second voltage detection unit 22, the first current detection unit 31, and the second current detection unit 32) for detecting currents and voltages in the first conductive path 51 and the second conductive path 52. The control unit 3 is configured to turn, if the value detected by any of the detection units is within a predetermined abnormality range when the third switch unit 13 is ON, the third switch unit 13 off (specifically turn all of the first switch unit 11, the second switch unit 12, and the third switch unit 13 off). For example, if the value detected by the first voltage detection unit 21 is an abnormal value when the third switch unit 13 is ON, the control unit 3 turns all of the first switch unit 11, the second switch unit 12, and the third switch unit 13 off, and also if the value detected by the second voltage detection unit 22 is an abnormal value when the third switch unit 13 is ON, the control unit 3 turns all of the first switch unit 11, the second switch unit 12, and the third switch unit 13 off. According to this configuration, for example, if an earth fault has occurred on one power storage unit side when the third switch unit 13 is in the ON state, and the value detected by the detection unit is within a predetermined abnormality range corresponding to the earth fault state, it is possible to rapidly switch the third switch unit 13 to the OFF state. Accordingly, it is possible to interrupt a current flowing through the bypass unit 5. Moreover, it is possible to suppress a voltage reduction that may occur on the other power storage unit side (normal power storage unit side) up to the completion of the switching of the third switch unit 13 to the OFF state, by using a resistance component of the resistance unit 7 provided in the bypass unit 5, and thus it is possible to cut off the portion on the other power storage unit side (normal power storage unit side) from the portion in which the short-circuit abnormality has occurred while keeping the short-circuit abnormality from having an influence.

Other Embodiments

The present invention is not limited to the embodiments described with reference to the description above and the drawings, and the technical scope of the present invention encompasses, for example, the following embodiments.

(1) Although, in the above-described embodiment, actuators (for example, motorized power steering systems) that require redundancy are exemplified as the first electrical load 81 and the second electrical load 82, both components are not limited to the configuration. For example, the first electrical load 81 may be configured as a sensing device such as a radar, ultrasonic sensor or a camera, and the second electrical load 82 may be configured as a backup sensing device that has the same function as this. Furthermore, the load connected to the first power storage unit 91 side, and the load connected to the second power storage unit 92 may have different functions.

(2) Although, in the above-described embodiment, the first voltage detection unit 21, the second voltage detection unit 22, the first current detection unit 31, and the second current detection unit 32 are provided as the detection units, any one or some of the detection units may also be omitted.

(3) Although, in the above-described embodiment, only one series circuit 6 in which the resistance unit 7 and the third switch unit 13 are connected in series to each other is provided, in any case, the bypass unit 5 may be configured such that a plurality of series circuits 6 are provided.

Figure 6:
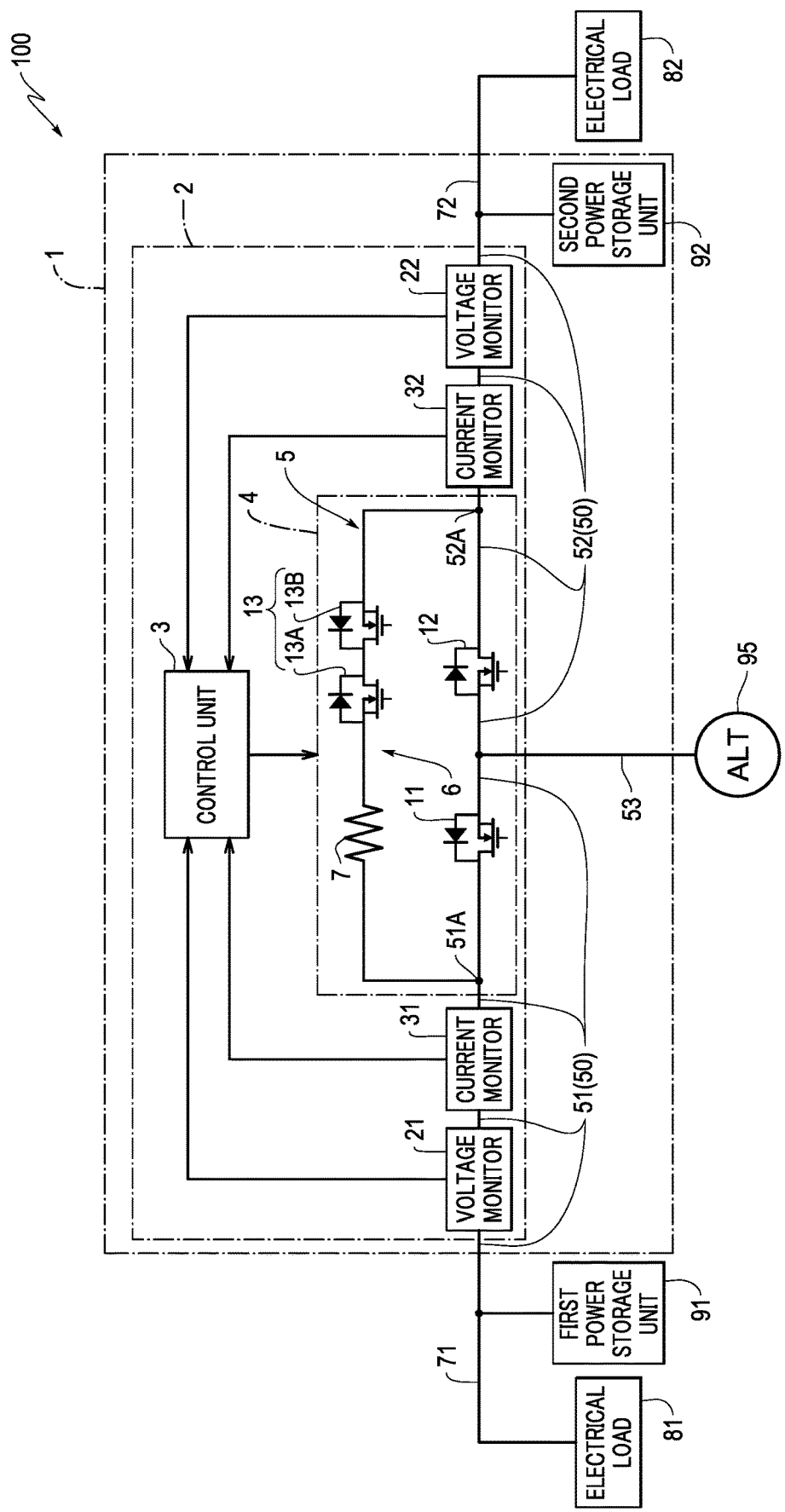
FIG. 6 is a circuit diagram schematically illustrating an example of an on-board power supply system in which a relay device and an on-board power supply device are installed, according to another embodiment.

(4) Although, in the above-described embodiment, each of the first switch unit 11, the second switch unit 12, and the third switch unit 13 is constituted by two MOSFETs, in any case, any one or all of the switch units may be constituted by semiconductor switches other than MOSFETs, or may be mechanical relays. Furthermore, the configuration shown in FIG. 2 may be modified as shown in FIG. 6. The example of FIG. 6 differs from the representative example of Embodiment 1 (configuration of FIG. 2) in that the first switch unit 11 and the second switch unit 12 are each constituted by a single MOSFET, and are otherwise the same as those of the representative example of Embodiment 1.

(5) Although, in the above-described embodiment, the configuration is such that the second switch unit 12 does not fail to be turned off when the first switch unit 11 is turned on, and the first switch unit 11 does not fail to be turned off when the second switch unit 12 is turned on, the present invention is not limited to this configuration. For example, a configuration is also possible in which, in addition to the first control in which the first switch unit 11 is turned on and the second switch unit 12 is tuned off and the second control in which the second switch unit 12 is turned on and the first switch unit 11 is turned off, a third control in which, upon a predetermined condition being met, both of the first switch unit 11 and the second switch unit 12 are turned on is performed.

(6) Although, in the above-described embodiment, the relay device 2 and the second power storage unit 92 are integrated into a single unit, in any case, the power supply device 1 may also be configured such that they are not integrated into a single unit.

LIST OF REFERENCE NUMERALS

1 . . . On-board power supply device (power supply device)
2 . . . Relay device
3 . . . Control unit
5 . . . Bypass unit
6 . . . Series circuit
7 . . . Resistance unit
11 . . . First switch unit
12 . . . Second switch unit
13 . . . Third switch unit
51 . . . First conductive path
52 . . . Second conductive path
91 . . . First power storage unit
92 . . . Second power storage unit
95 . . . Power generator

The invention claimed is:

1. A relay device comprising:
a first switch configured to switch a first conductive path, which serves as a path between a power generator and a first power storage device, between a current flow permissive state and a current flow interruption state;
a second switch configured to switch a second conductive path, which serves as a path between the power generator and a second power storage device, between a current flow permissive state and a current flow interruption state;
a bypass path provided with a series circuit in which a resistor and a third switch are connected in series to each other, the series circuit having one end electrically connected to a portion between the first switch and the first power storage device and another end electrically connected to a portion between the second switch and the second power storage device so that the resister and the third switch are in series between the first power storage device and the second power storage device and are in parallel with a series of the first switch and the second switch; and
a controller is configured to turn the first switch, the second switch, and the third switch between on and off states.

2. The relay device according to claim 1,
wherein the controller is configured to always turns off the second switch when at least the first switch is turned on, and always turns off the first switch when at least the second switch is turned on.

3. The relay device according to claim 2,
wherein the controller is configured to turn off the second switch and turn on the third switch when at least the first switch is turned on, and turn off the first switch and turn on the third switch when at least the second switch is turned on.

4. The relay device according to claim 2, further comprising:
a sensor configured to detect at least one of a current and a voltage in at least one of the first conductive path and the second conductive path,
wherein, the controller is configured to switch the third switch to an OFF state when a value detected by the sensor is within a predetermined abnormality range and at least the third switch is in an ON state.

5. A power supply device comprising:
the relay device according to claim 1, and
the second power storage device.

6. The relay device according to claim 1, wherein:
the first switch, the second switch and the third switch each comprise two MOSFETs connected in series with body diodes in opposite directions.

* * * * *